United States Patent
Brown et al.

(10) Patent No.: US 7,698,077 B2
(45) Date of Patent: Apr. 13, 2010

(54) SYSTEM AND METHOD FOR SIGNAL LEVEL DETECTION

(75) Inventors: Matthew Douglas Brown, Kinburn (CA); Sheldon James Hood, Richmond (CA); Guy Jacque Fortier, Kanata (CA); Stan Harry Blakey, Kanata (CA)

(73) Assignee: Applied Micro Circuits Corporation, San Diego, CA (US)

( * ) Notice: Subject to any disclaimer, the term of this patent is extended or adjusted under 35 U.S.C. 154(b) by 178 days.

(21) Appl. No.: 11/983,645

(22) Filed: Nov. 9, 2007

(65) Prior Publication Data
US 2009/0121790 A1 May 14, 2009

(51) Int. Cl.
*G01R 15/00* (2006.01)
(52) U.S. Cl. ......................................... 702/57
(58) Field of Classification Search ............... 702/57; 341/139; 330/279
See application file for complete search history.

(56) References Cited
U.S. PATENT DOCUMENTS
3,516,085 A * 6/1970 Dano ..................... 341/139

* cited by examiner

*Primary Examiner*—Tung S Lau
*Assistant Examiner*—Xiuquin Sun
(74) *Attorney, Agent, or Firm*—Law Office of Gerald Maliszewski; Gerald Maliszewski

(57) ABSTRACT

An electronic signal level detection system and method are provided. The method receives an analog input signal having a variable voltage and compares the input signal voltage to a threshold. A detection signal is generated for input signal voltages exceeding the threshold in a periodic first time frame. In a second periodic time frame (following the first time frame), a count is updated in response to the generated detection signals. The count is used to create a metric representative of the difference between the input signal voltage and the threshold. The count is incremented in response to the generating a detection signal ("1") in the first time frame, and decremented in response to not generating a detection signal ("0") in the first time frame.

10 Claims, 10 Drawing Sheets

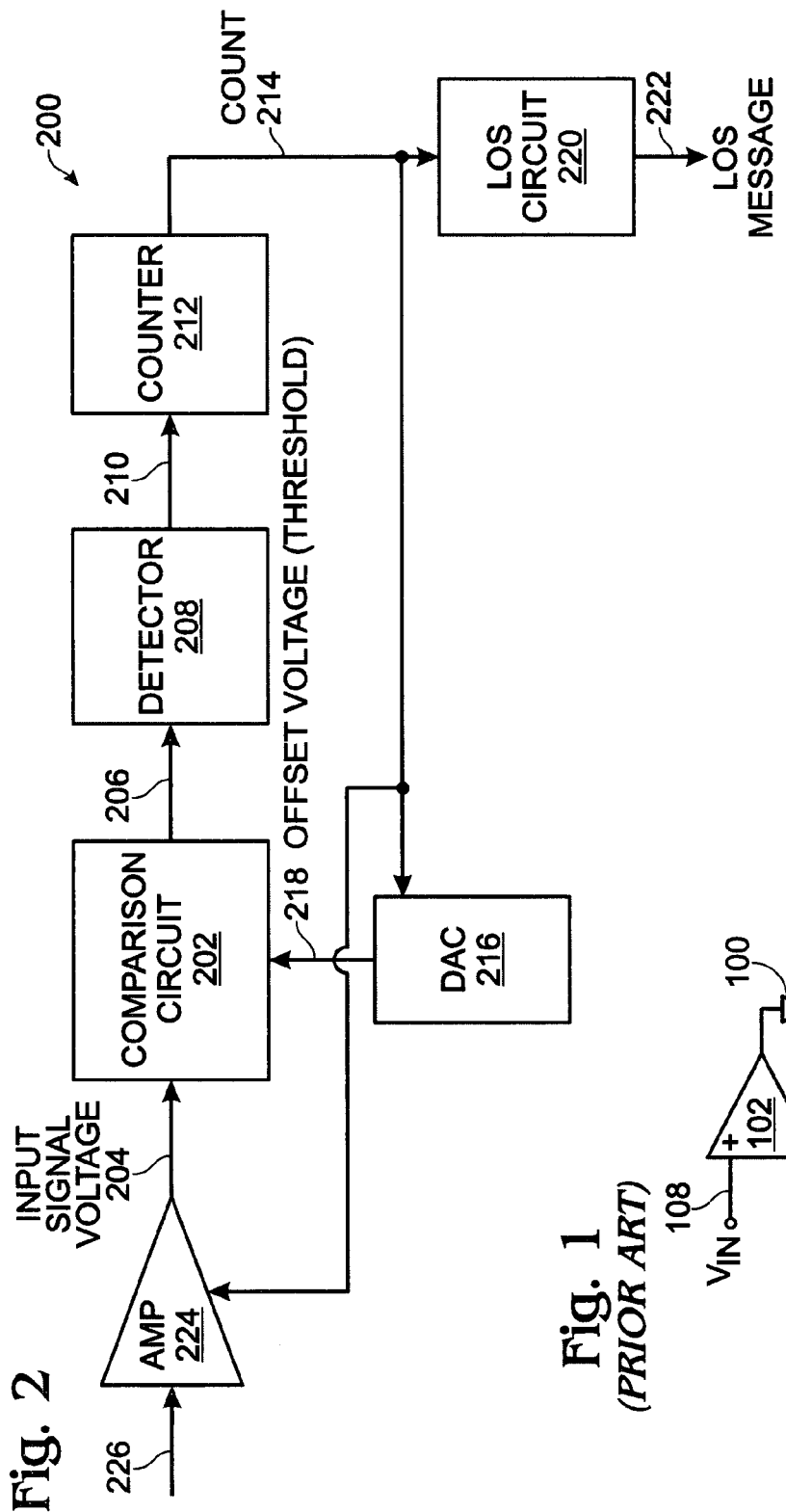
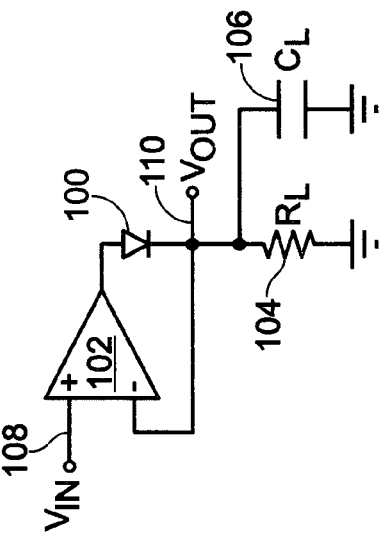
Fig. 2
Fig. 1 (PRIOR ART)

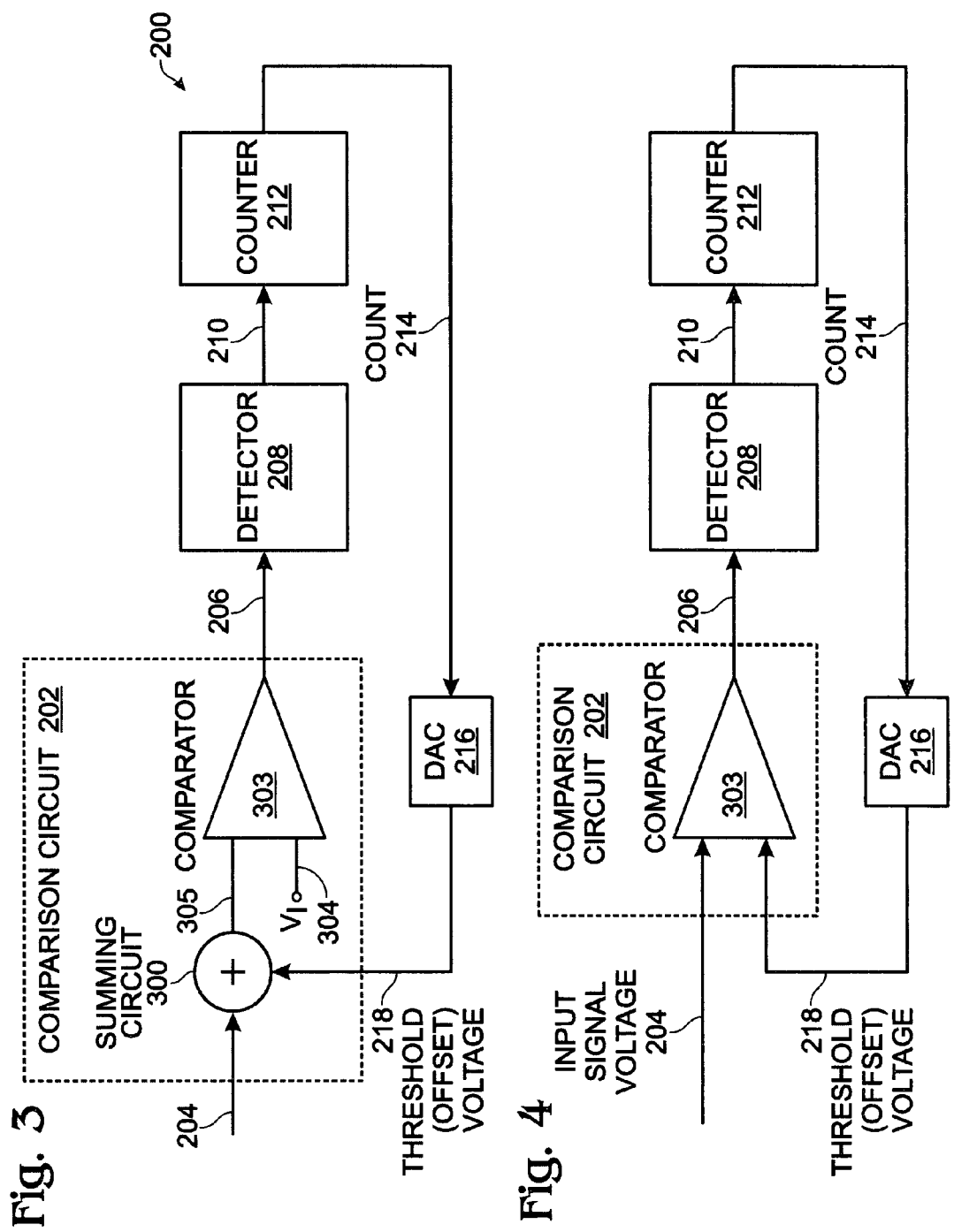

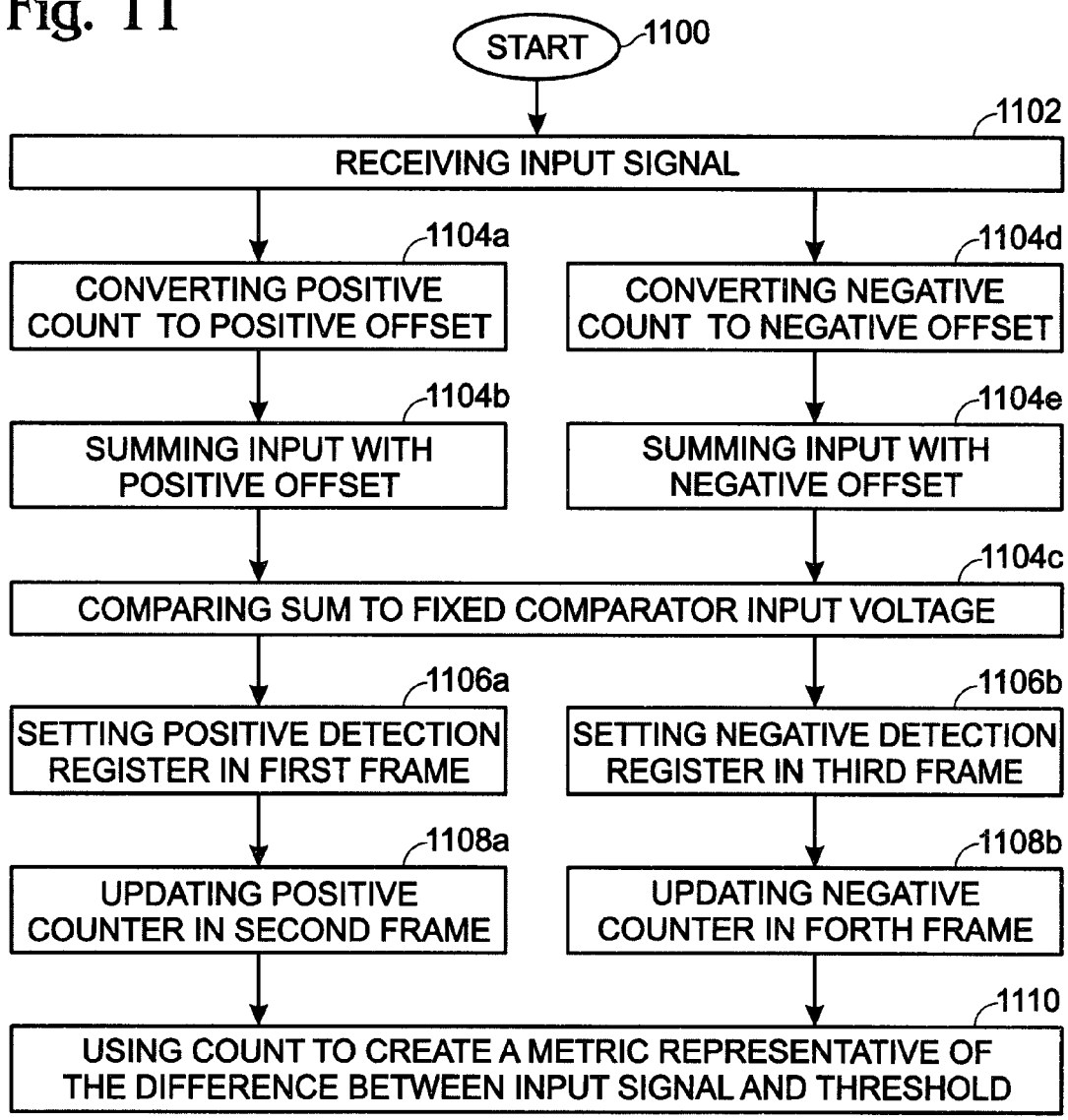

SYSTEM AND METHOD FOR SIGNAL LEVEL DETECTION

BACKGROUND OF THE INVENTION

1. Field of the Invention

This invention generally relates to signal level detection circuitry and, more particularly, to a system and method for an improved electrical signal level detection circuit and associated detection method.

2. Description of the Related Art

An electrical signal level detection function is commonly achieved using an analog peak detector, forward biasing of a diode, bipolar base-emitter (BE) junction, or FET-charged capacitor until the DC voltage of the capacitor approaches the peak level of the AC signal. A large time constant is achieved by maximizing the size of the capacitor and minimizing the discharge current. Various factors that tend to degrade the accuracy of these measurements include device mismatches, changes in temperature, varying bandwidths, and signal content. One approach to addressing these inaccuracies involves the use of conventional closed loop methods. However, use of feedback is problematic for high speed signals, effectively forcing response times to be too slow. Various feedforward techniques allow faster response time, but these techniques require large internal devices, consuming die area or use of external components, and the measurements are not sufficiently repeatable.

FIG. 1 is a schematic drawing of a simple peak detector circuit (prior art). The diode 100 acts as a rectifier, and in combination with an operational amplifier 102, more closely mimics the response on an ideal diode. The purpose of the circuit is to detect the maximum positive peak voltage at Vin 108. The measurement is provided as a DC voltage at Vout 110. When the input is positive, it is amplified by the operational amplifier, biasing the diode. Current is applied to the load ($R_L$ 104 and $C_L$ 106) and, the feedback makes the output voltage Vout 110 equal to the input 108.

When the input voltage is negative, there is a negative voltage on the diode, effecting an open circuit. There is no current into the load and the opamp output voltage is zero. Practically, when the input becomes negative, the output of the operational amplifier can easily approach the negative supply voltage (not shown), causing saturation. Since it takes a finite time to recover from saturation, the frequency response of the circuit is impaired.

The use of non-linear circuit devices (i.e., a diode) makes signal level measurements very susceptible to variations in temperature and device process variations. Even with tightly controlled operating conditions and inclusion of temperature compensation techniques, the absolute accuracy of a conventional level detector varies. Further, the architecture is not easily portable from one device to another.

The high speed of signals, combined with the need to charge a large capacitor, causes conventional detector circuits to consume a large amount of power. The large time constant associated the detector hold time is achieved by using large capacitor values. However, as circuit dimensions get smaller, the relative size of these large-value storage capacitors is becoming larger.

New applications and markets are emerging that require better accuracy of level detection, lower power per port, a higher port density—achieved through more ports per device, smaller device size, and a smaller net footprint on the printed circuit board (PCB), by minimizing the number of external components such as filter capacitors.

It would be advantageous if a level detection method existed that addressed the above-mentioned speed and accuracy requirements, while not increasing die area and power.

It would be advantageous if level detection circuit existed to provide a lower power, more accurate, more portable, and more flexible signal level detector than is possible with conventional methods.

SUMMARY OF THE INVENTION

A signal level detection system and method are provided that address the above-mentioned problems associated with conventional designs. The present invention level detector improves accuracy by reducing the bandwidth requirements of the linear analog blocks, making the level detector less susceptible to the frequency response of the channel and circuit being measured. The reduced bandwidth design inherently requires less power. The digital implementation of the level detector permits a simple means of calibrating-out common mode offsets. Separate positive and negative peak detection automatically calibrates out differential offsets. Sufficiently long time constants are implemented through integration enabled with digital counters instead of capacitors. The use of counters instead of an integration capacitor reduces the size of the level detector circuit. Implementation in digital circuits is easily repeated (portable), efficient in that little quiescent current is required, and is less sensitive to location and routing.

Accordingly, an electronic signal level detection method is provided. The method receives an analog input signal having a variable voltage and compares the input signal voltage to a threshold. A detection signal is generated for input signal voltages exceeding the threshold in a periodic first time frame. In a second periodic time frame (following the first time frame), a count is updated in response to the generated detection signals. The count is used to create a metric representative of the difference between the input signal peak voltage and the threshold. In one aspect, the threshold may be a comparator with a fixed voltage reference, where the reference may be zero. In another aspect the comparator may be a limiting amplifier without a voltage reference.

More explicitly, detection signals are generated by setting the output of a detection register to a first value (e.g., "0") for input signal voltages exceeding the threshold. If no detection signals are generated, the output of the detection register is set to a second value, different from the first value (e.g., "1"). The count is incremented in response to the generating a detection signal ("0") in the first time frame, and decremented in response to not generating a detection signal ("1") in the first time frame.

In one aspect, the count is converted to an analog offset (threshold) voltage. Then, the input signal voltage is summed with the offset voltage, and the sum is compared to a fixed comparator reference voltage. Alternately, the count is converted to an analog offset voltage, and the offset voltage is used as the threshold. In another aspect, the input signal voltage has a positive voltage with respect to an average input signal voltage, and a variable negative voltage with respect to the average. Then, the method keeps separate counts associated with the positive and negative input voltages, and a predetermined difference is maintained between the positive input signal voltage and the threshold, as well as between the negative input signal voltage and the threshold.

Additional details of the above-described method and an electronic signal level detection system are provided below.

BRIEF DESCRIPTION OF THE DRAWINGS

FIG. 1 is a schematic drawing of a simple peak detector circuit (prior art).

FIG. 2 is a schematic block diagram depicting an electronic signal level detection system.

FIG. 3 is a schematic block diagram depicting a first variation of the level detector of FIG. 2.

FIG. 4 is a schematic block diagram depicting a second variation of the level detector of FIG. 2.

FIG. 11 is a flowchart illustrating a more detailed electronic signal level detection method.

DETAILED DESCRIPTION

Figure 5:
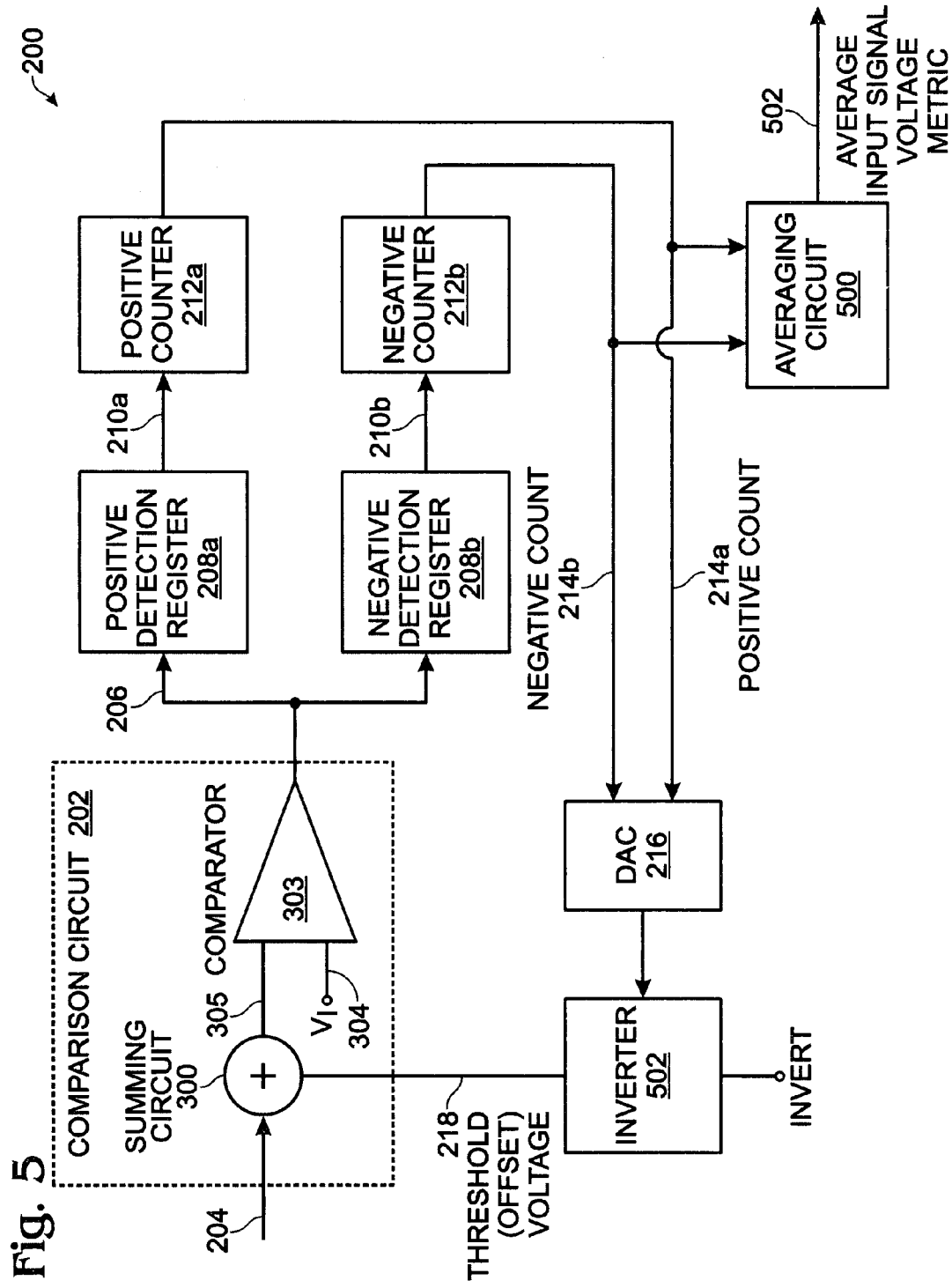
FIG. 5 is a schematic block diagram depicting a third variation of the level detector of FIG. 2.

FIG. 2 is a schematic block diagram depicting an electronic signal level detection system. The system 200 comprises a comparator 202 having a first input on line 204 to receive an analog input signal having a variable voltage. The comparison circuit 202 compares the input signal voltage to a threshold on line 218 and supplies a comparator signal at an output on line 206 for input signal voltages exceeding the threshold. A detector 208 has an input on line 206 to receive the comparator signal and an output on line 210 to supply detection signals responsive to receiving comparator signals in a periodic first time frame.

A counter 212 has an input on line 210 to receive the detection signals and an output on line 214 to supply a count in a periodic second time frame following the first time frame. More explicitly, the counter 212 increments the count in response to receiving a detection signal in the first time frame, and decrements the count in response to not receiving a detection signal in the first time frame. A digital-to-analog converter (DAC) 216 has an input on line 214 to receive the count and has an output on line 218 to supply an offset or threshold voltage. By adjusting the threshold, a metric representative of the difference between the input signal voltage and the threshold is created, which is responsive to the count. Alternately stated, the DAC output voltage, or threshold on line 218 is equal to the peak voltage of the input signal. Simultaneously, the DAC output voltage is proportional to the digital input value, which is the count on line 214. The digital input is therefore correlated to the peak value of the input signal peak voltage. So, the count on line 214 is a value (or metric) representative of the peak value of the input signal. The count is a value that may also be used by other system functions, such as gain control and LOS detection, as explained in more detail below.

In one aspect, the detector 208 is a detection register setting a detection register output to a first value (e.g., a "0") in response to receiving a comparator signal on line 206, while the detection register output is set to a second value, different from the first value (e.g., a "1"), in response to not receiving a comparator signal. The count value, or the average of the count values, is a digital value proportional to the signal level at the input the detector.

In another aspect, a loss-of-signal (LOS) circuit 220 has an input connected to the counter 212 to accept the count on line 214. The LOS circuit 220 has an output on line 222 to supply a message indicating the absence of the input signal in response to reading a count less than a low limit, and a message determining the presence of the input signal in response to reading a count greater than a high limit. Note: the message may be as a simple as a single bit value. The high and low limits may be the same value for simplicity, or different values chosen to effect hysteresis.

In a different aspect, a variable gain amplifier 224 has an input on line 226 to accept a signal, and a control input connected to receive the count on line 214. The amplifier 224 has an output connected to the comparison circuit 202 to supply the input signal voltage on line 204. The amplifier gain is adjusted in response to the count. As explained in more detail below, the count may be compared to target thresholds and modified by intervening gain control circuitry (not shown). In this manner, the system 200 is able to maintain a predetermined voltage level on line 204 by increasing the gain in response to a negative count, and decreasing the gain in response to a positive count on line 214.

In one aspect, the counter 212 supplies an n-bit counter value on line 214 in response to the detection signals, and the DAC 216 accepts the m most significant bits of the counter value, where m is less than or equal to n. That is, the least significant bits are masked to enable a lowpass loop filter response.

FIG. 3 is a schematic block diagram depicting a first variation of the level detector of FIG. 2. A summing circuit 300 has an input on line 204 to accept the input signal voltage and an input to accept the offset (threshold) voltage on line 218. The summing circuit has an output connected to a comparator 303 first input on line 305. In this aspect, the comparator 303 has a second input connected to a fixed comparator input reference voltage (V1) on line 304. Thus, the input signal voltage is measured with respect to a variable threshold voltage and a fixed comparator input reference. As understood by those with skill in the art, comparator 303 may be a limiting amplifier without a reference voltage.

FIG. 4 is a schematic block diagram depicting a second variation of the level detector of FIG. 2. In this aspect, the second input to the comparator 303 is connected to the offset (threshold) voltage on line 218. Thus, the threshold is a variable threshold voltage. In this manner, the offset voltage may be adjusted until it is made equal to the input signal voltage (or equal to a predetermined offset value). Thus, the predetermined difference between the input signal voltage on line 204 and the threshold voltage of line 218 is typically about zero.

Although not specifically shown in FIGS. 3 and 4, it should be understood that the system 200 may further include the adjustable gain amplifier and LOS circuit described in FIG. 2, as is presented in more detail below (see FIG. 7).

FIG. 5 is a schematic block diagram depicting a third variation of the level detector of FIG. 2. The variations depicted in FIGS. 2-4 are limited in that only one phase of a signal is considered. In the variation of FIG. 5, both the positive and negative peaks of an input voltage signal can be measured. That is, the comparator 303 compares an input signal voltage (line 204) having a positive voltage with respect to an average input signal voltage, to a high voltage threshold in the first time frame. The comparator 303 also compares a variable negative voltage with respect to the average, to the low voltage threshold in a periodic third time frame following the second time frame. Again, comparator 303 may be a limiting amplifier without an explicit reference voltage.

A positive detection register 208a sets an output on line 210a to the first value in response to receiving comparator signals in the first time frame, and a negative detection register 208b sets output on line 210b to the first value in response to receiving comparator signals in the third time frame. Then, a positive counter 212a supplies a positive counter value on line 214a in the second time frame, and a negative counter 212b supplies a negative counter value on line 214b in a periodic fourth time frame following the third time frame.

The DAC 216 converts the positive counter value to a positive offset voltage on line 218 in the first time frame. The DAC 216 converts the negative counter value to a negative offset (threshold) voltage in the third time frame. In one aspect not shown, the DAC 216 supplies an inverted negative offset voltage. Alternately as shown, the negative offset voltage may be inverted by an inverter circuit 502 interposed between the DAC 216 and the summing circuit 300. The summing circuit 300 sums the input signal voltage on line 204 with the positive offset (threshold) voltage on line 218 in the first frame, and sums the input signal voltage on line 204 with the inverted negative offset voltage on line 218 in the third time frame.

Alternately but not shown, a positive comparator, connected to the positive detection register, may be used to track the positive input signal voltage excursions. Likewise, a separate negative comparator, connected to the negative detection register, may be used to track the negative input signal voltage excursions. In this variation it would be possible to capture and update both the positive and negative voltage paths in the first and second time frames.

Figure 6:
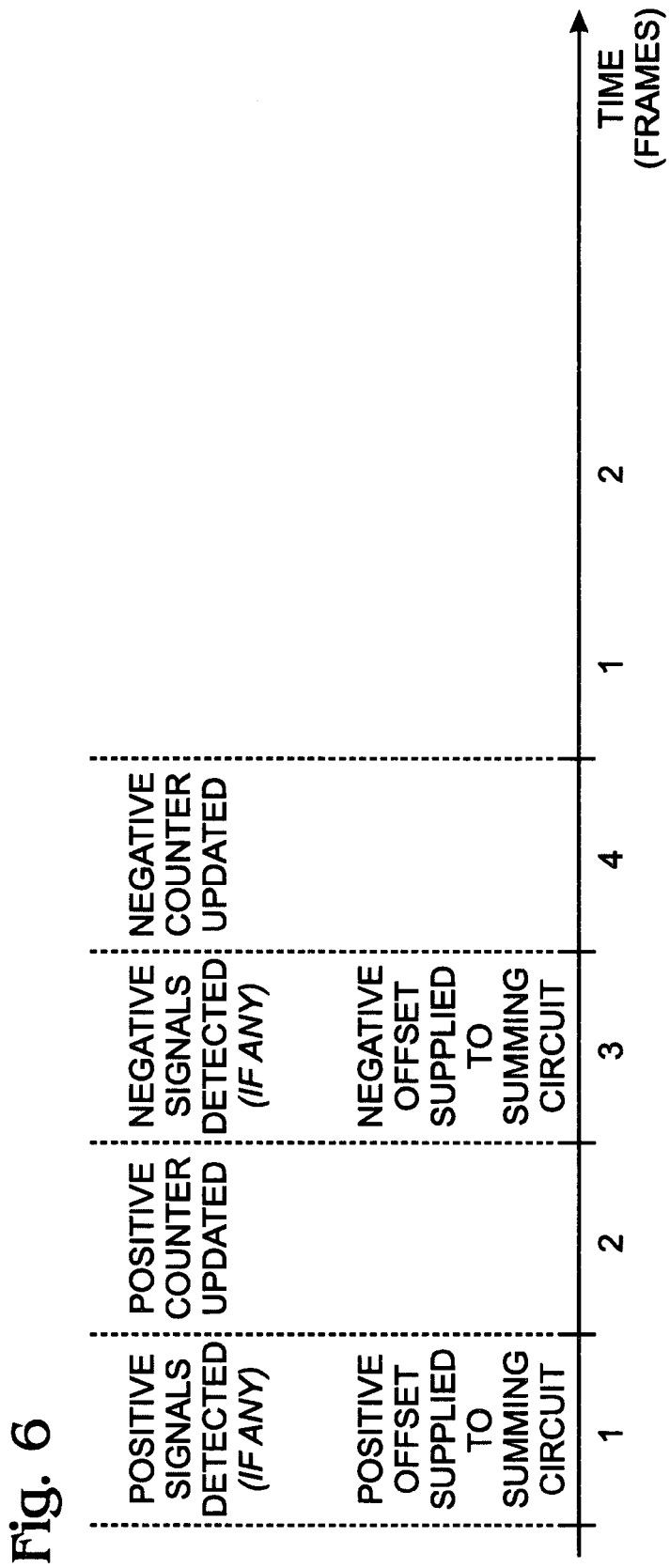
FIG. 6 is a timing diagram depicting signals from the level detector of FIG. 5.

FIG. 6 is a timing diagram depicting signals from the level detector of FIG. 5.

Returning to FIG. 5, in one aspect, an averaging circuit 500 has inputs on lines 214a and 214b to accept the positive and negative counter values, respectively. The averaging circuit 500 supplies an average input signal voltage measurement at an output on line 502, determined by summing the positive counter value with the negative counter value. As one simple example, an average may be obtained by summing the positive and negative counter values and dividing by 2.

It should be understood that although the system has been defined in terms of node voltages, it would be within the skill of one in the art to enable circuitry of equivalent functionality defined in terms of current flows instead of node voltages. Further, although the above-described system has been described in terms of hardware components, some aspects of the system may be enabled using a set of microprocessor instructions stored in memory that may be enabled using a microprocessor or logic-coded state machine.

Functional Description

The above-described level detector provides metric proportionality to the signal amplitude of an analog data-modulated signal. A non-return-to-zero (NRZ) formatted signal is considered, which may be distorted by various impairments in the channel. However, it should be understood that the system is not limited to the measurement of signals in just this signal format. Signal impairments may be caused by the limited bandwidth of active and passive components, modal distortion in multi-mode fiber (MMF), chromatic distortion in single mode fiber (SMF), frequency dependent loss in cables, stripline, and microstrip, or reflections due to transitions such as device packaging interconnect, PCB vias, and connectors.

In one application, the signal level detector may be used to measure the output of a variable gain amplifier (VGA) to determine in which direction, if necessary, to adjust the gain to achieve a desired target level. A system consisting of the VGA, level detector, and gain control is commonly known as an automatic gain control amplifier (AGC). In another application, the signal level detector may be used to measure loss of signal (LOS). The LOS circuit determines if an input signal falls below or above a target threshold to detect if a signal is present or not. The state where a signal is not present is typically referred to as LOS.

Figure 7:
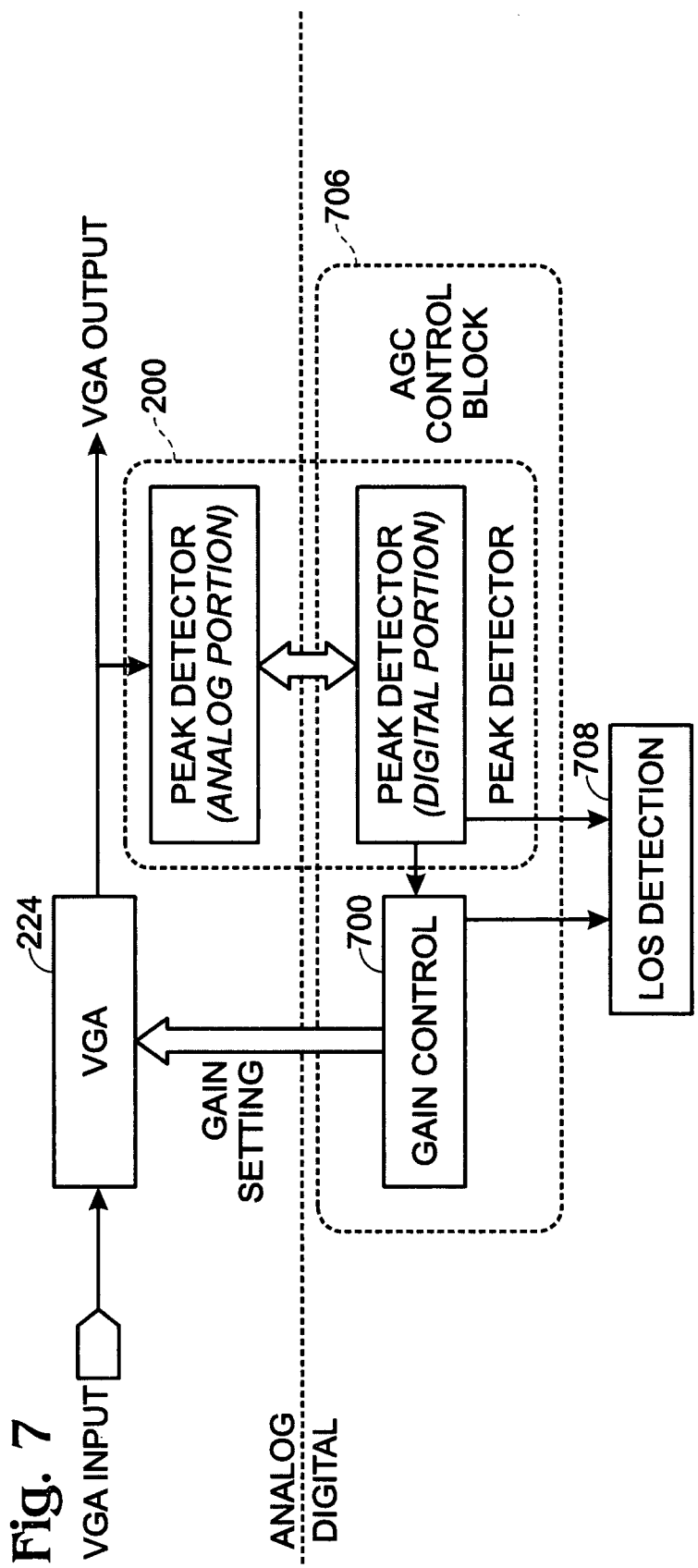
FIG. 7 is an exemplary high-level block diagram of an AGC.

FIG. 7 is an exemplary high-level block diagram of an AGC. The gain control function 700 controls the gain of the VGA 224 through the gain setting in response to counter values from the peak detector block, which is also referred to herein as the level detector system 200. The peak detector 200 includes an analog and a digital portion that work in tandem. The gain control function 700 determines whether the gain must increase, decrease, or stay the same. This determination is based upon the peak detector's measurement of the VGA output level, which is compared to a target level. The LOS detection function 708 determines the current LOS state using the level detected by the peak detector function 200, the state of the AGC gain control function 700, and provided thresholds.

Figure 8:
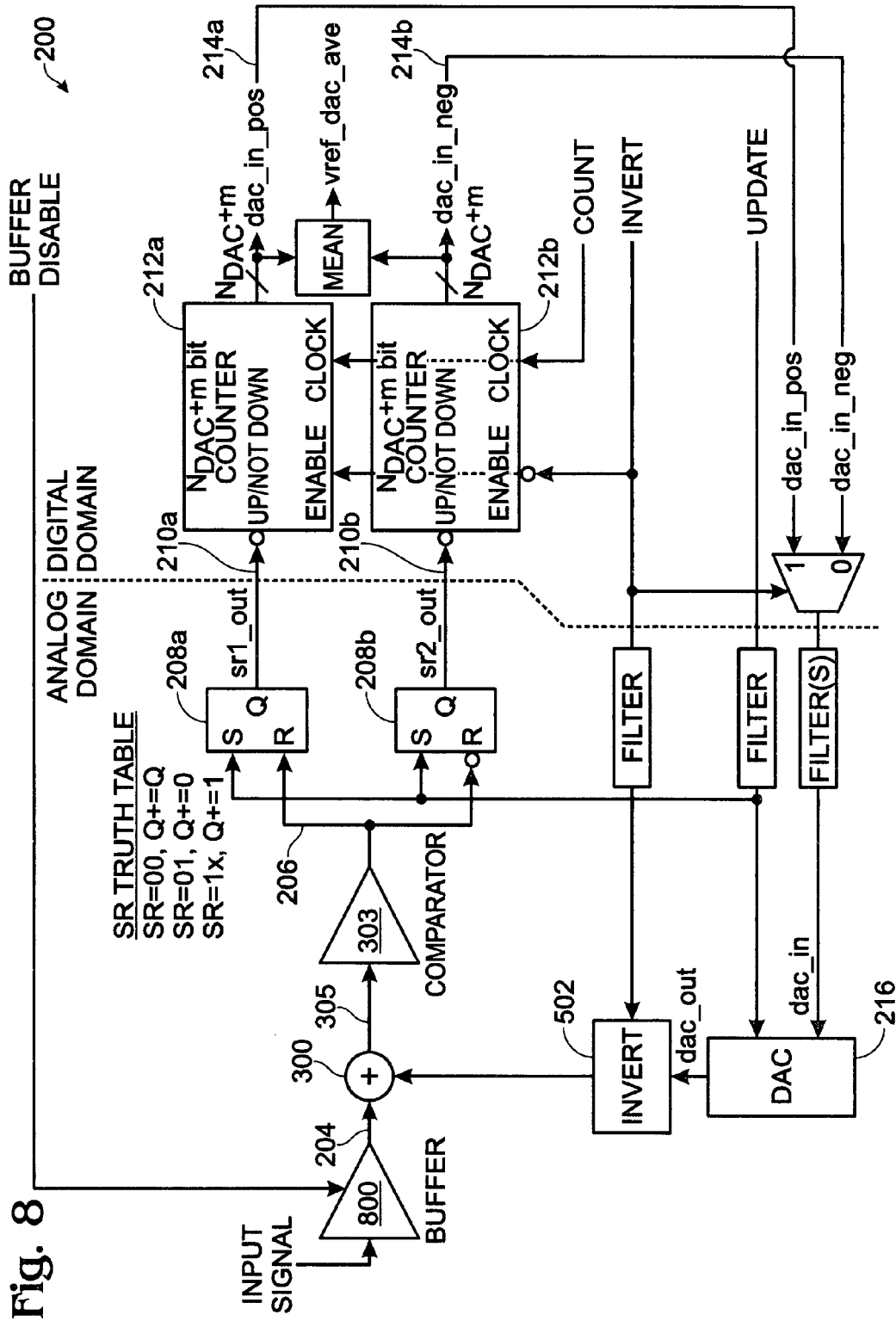
FIG. 8 is a block diagram illustrating the peak detection function of FIG. 5 in greater detail.

FIG. 8 is a block diagram illustrating the peak detection function of FIG. 5 in greater detail. The level detection system or peak detector 200 manages the analog portion. This implementation essentially finds a voltage where the signal peaks to do not cross (or more accurately, rarely cross). In another aspect not shown, the DAC 216 is able to provide negative, as well as positive, offset voltages, so that the inverter 502 is unnecessary.

Figure 9:
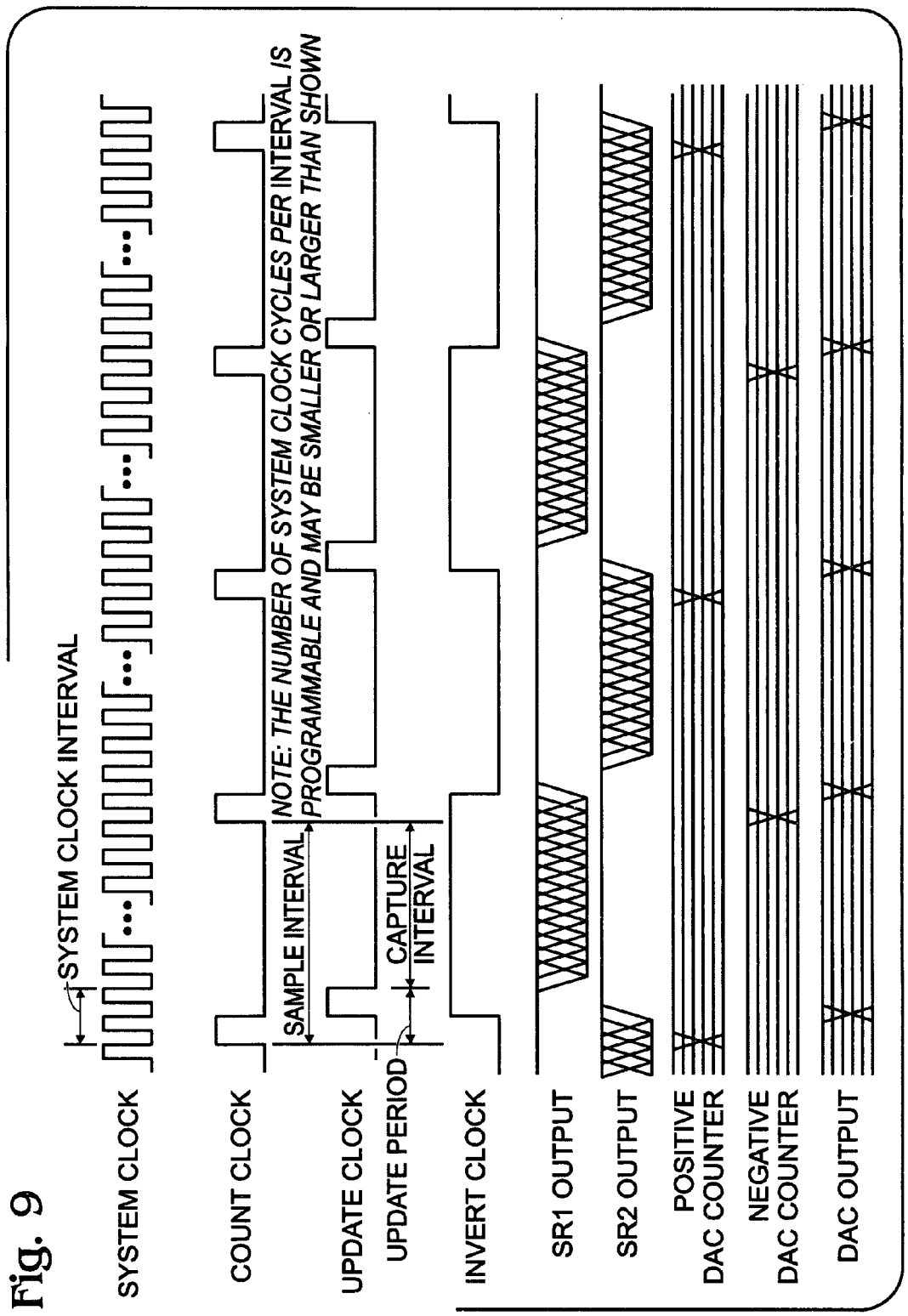
FIG. 9 is a timing diagram associated with the level detection system of FIG. 8.

FIG. 9 is a timing diagram associated with the level detection system of FIG. 8.

Viewing both FIGS. 8 and 9, the implementation captures peaks on regular "sampling" intervals. The sampling intervals consist of an update interval and a capture interval. Note: the positive capture interval is referred to herein as the first time frame. The positive update interval is the second time frame, the negative capture interval is the third time frame, and the negative update interval is the fourth time frame. During the update interval the counters 214a/214b are updated, and the DAC 216 is loaded with a new value. The SR flipflops 208a/208b are forced to the set state. In the capture interval, any signal peak that crosses the threshold set by the DAC clears the output of the SR flip flop on lines 210a/210b. It should be understood that the SR flipflop circuitry described is not entirely conventional. The sequential logic is defined at the top of FIG. 8. However, it would be within the skill of one practicing in the art to design circuitry to enable the same or equivalent logic sequences for capturing the state of the comparator and subsequently resetting the output.

On alternate sample intervals, the sign of the DAC output is alternated so that peaks on the ones and zeros can be measured. One SR flip-flop is used for each of the positive and negative sampling intervals since the crossings have opposite polarities.

At the end of each sampling interval, a counter is updated based on the output of the SR flip-flop. When a crossing is detected (SR output is zero) the counter value increments to decrease the likelihood of a crossing. When no crossing is detected (SR output is one) the counter value decrements. One counter 212a is provided for the positive and another 212*b* for the negative cycle. The use of 2 counters permits independent detection of the positive peak level and the negative peak level. In the case where there is a DC offset in the peak detector, the average of the two levels gives the actual mean peak value. The average value of the positive and negative peak counters may be used by the LOS detection and gain demand functions (see FIG. 7) as an indication of the current AGC output level.

Each counter may be implemented with a size (number of bits) larger than that needed for the DAC. This arrangement acts as a filter so that multiple peaks or lack of peaks in the signal content do not quickly move the output. The DAC then uses only the required MSBs (most significant bits) as input.

The count clock pulse causes the counter to increment or decrement based on the input from the SRFF output. The update clock pulse latches a new value into the DAC and sets the SRFF outputs. While the count and update clocks are low, the SRFF clears if the comparator output is high.

The bandwidth of the combined buffer and comparator may be much smaller than that of the bit rate of the signal. For instance, the bandwidth may be as low as 750 megahertz (MHz) for a typical 10 gigabit per second (Gbps) signal. The bandwidth must be well controlled to mitigate related variations in peak detector sensitivity. By lowering the bandwidth requirement it is possible to reduce the current significantly. The minimum bandwidth is limited by the expected statistical frequency of long runs of consecutive identical digits (CIDs), i.e., long runs of ones or zeros in the data. The minimum bandwidth of 750 MHz for the example above assumes a relatively frequent occurrence of 9-bit CIDs, which is a run of 9 consecutive bits having the same value. The assumption is based upon the observation that the occurrence of ones and zeros in data is significantly random. With this assumption, common test patterns such as PRBS9 (pseudorandom binary sequence, with 9 number bits in the sequence generator, PRBS31, or the 57-bit pseudorandom sequence specified in IEEE Std 802.3-2005 Clause 52.9.1.1 are compatible. Similar data traffic, with or without significantly random content, scrambled with the IEEE 57-bit scrambler specified in IEEE Std 802.3-2005 Clause 49.2.6 is also compatible.

The reduction in bandwidth improves the accuracy and/or repeatability of the detector in couple of ways. First, by allowing a much lower bandwidth, the bandwidth can be set to a well controlled value rather than having the bandwidth vary with process and environmental parameters. Second, by detecting the voltage modulation amplitude (VMA), which is the peak to peak voltage of a low frequency—such as a repeating pattern of 8 ones and 8 zeros (a square wave), rather than peaks, the level is less variable. Another benefit is that the circuits may operate at low current levels and thus consume less power.

Common mode offsets in the detection circuit may be mitigated by measuring the positive and negative peak values with no signal at the buffer 800 output on line 204. This result may be achieved by disabling the buffer.

The LOS state is updated following each averaged level update. The LOS state is determined by comparing the averaged level to the LOS assert and de-assert thresholds. LOS asserts when the input level falls below a programmable lower threshold and de-asserts when it goes above a programmable upper threshold.

Majority debouncing may also be employed to ensure reliable detection. LOS detection may employ majority decoding with two variable parameters: proportion and window size. When the peak detector value is sampled regularly, a detection window of 1-to-N samples can be used to detect the LOS state. The LOS state may be based on detecting anywhere from 1 to N samples below the detection threshold. Different criteria may be used for LOS assertion and de-assertion.

IEEE 10 GBASE-S and 10 GBASE-L define conventional 10 Gbps Ethernet optical interfaces. The optical specifications put increased demand upon a detecting device in terms of both signal transmission and detection. In particular, the level detection must be very accurate since the detection range is small and the various tolerances associated with the optical devices leave little tolerance available for the electrical devices. For these applications, accurate signal level detection is required.

IEEE 10 GBASE-LRM has similarly challenging detection tolerances. However, the problem is further complicated in two ways. First, the signal eye opening, as observed on a scope, may be completely closed due to the poor response of the channel. Second, the signal must be processed by a series of linear blocks; in order to make optimal use of the available dynamic range of the blocks, the signal level at the output of the AGC must be very accurate. Too low of a signal results in higher relative noise levels and too high means higher non-linear distortion.

SFP+ (Small Form Factor Package for 10G) modules put further stress upon the receiver. These modules may be compared to a conventional XENPAK, X2, and XFP modules. The SFP+ modules do not recover and retime the incoming signal (whereas XENPAK, X2, and XFP do), they only convert the signals between electrical and optical format. The SFP+ application adds extra stress on the received signal including frequency distortion and crosstalk noise.

Figure 10A:
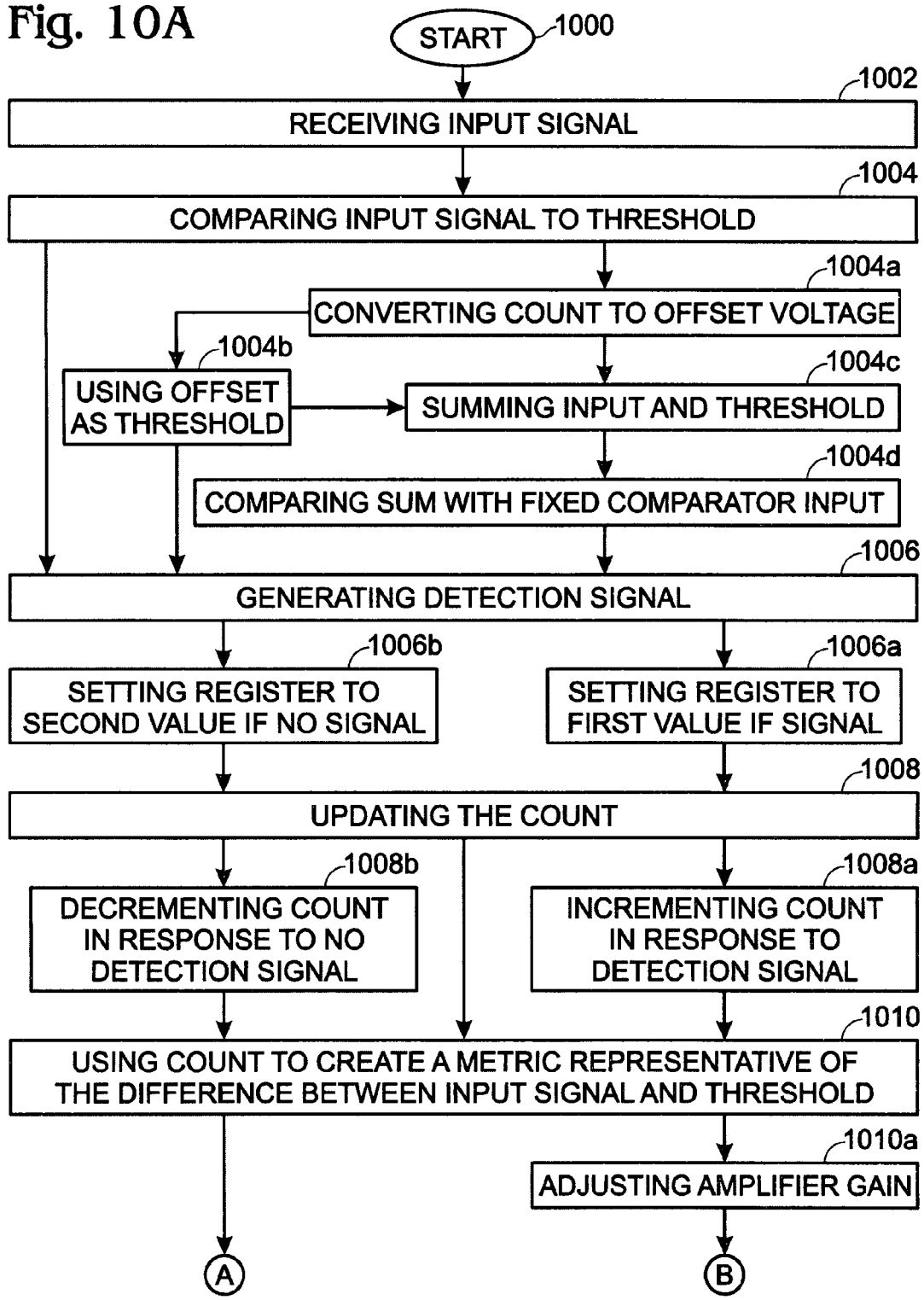
FIGS. 10A and 10B are flowcharts illustrating an electronic signal level detection method.
Figure 10B:
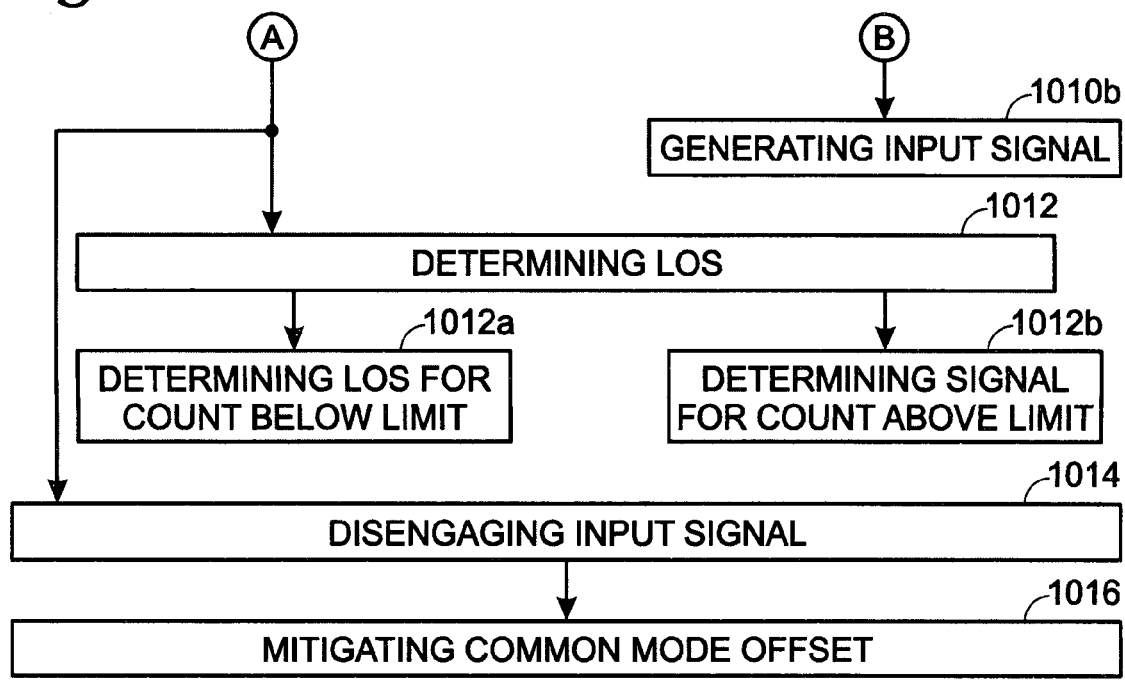

FIGS. 10A and 10B are flowcharts illustrating an electronic signal level detection method. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1000.

Step 1002 receives an analog input signal having a variable voltage. Step 1004 compares the input signal voltage to a threshold. Step 1006 generates a detection signal for input signal voltages exceeding the threshold in a periodic first time frame. In response to generating detection signals, Step 1008 updates a count in a periodic second time frame following the first time frame. Step 1010 uses the count to create a metric representative of the difference between the input signal voltage and the threshold.

In one aspect, generating detection signals for input signal voltages exceeding the threshold (Step 1006) includes substeps. Step 1006*a* sets an output of a detection register to a first value in response to detection signals. In response to no detection signals, Step 1006*b* sets the output of the detection register to a second value, different from the first value. In another aspect, updating the count in Step 1008 includes substeps. Step 1008*a* increments the count in response to the generating a detection signal in the first time frame. Step 1008*b* decrements the count in response to not generating a detection signal in the first time frame.

In one variation comparing the input signal voltage to a threshold (Step 1004) includes substeps. Step 1004*a* converts the count to an analog offset voltage. Step 1004*b* uses the offset voltage as the threshold. In another aspect, Step 1004*c* sums the input signal voltage with the threshold voltage. Step 1004*d* compares the sum with a fixed comparator reference voltage.

In one aspect, Step 1012 determines a loss of signal as follows. Step 1012*a* determines the absence of the input signal in response to reading a count less than a low limit. In response to reading a count greater than a high limit, Step 1012b determines the presence of the input signal. In some aspects, Step 1012 employs majority decoding with variable parameters of proportion and window size to determine LOS.

In another aspect, using the count to create the predetermined difference between the input signal voltage and the threshold in Step 1010 includes substeps. Step 1010a uses the count to adjust the gain of a variable gain amplifier connected to supply the input signal, and Step 1010b generates the predetermined input signal voltage.

In some aspects, the count is filtered. For example, Step 1008 may update an n-bit counter value in response to the detection signals. Then, the m most significant bits of the counter value are supplied to create the metric representative of the difference between the input signal voltage and the threshold, where m is less than or equal to n.

In another aspect, Step 1014 disengages the input signal voltage, and Step 1016 mitigates common mode offsets in the positive and negative count values in response to disengaging the input voltage signal. The process of mitigating common mode offsets may also be performed prior to Step 1002.

FIG. 11 is a flowchart illustrating a more detailed electronic signal level detection method. The method starts at Step 1100. Step 1102 receives an input signal voltage having a positive voltage with respect to an average input signal voltage, and a variable negative voltage with respect to the average. Step 1104 compares the positive voltage with a high voltage threshold, and compares the negative voltage with a low voltage threshold as follows. Step 1104a converts the positive counter value to a positive offset voltage in the first time frame. Step 1104b sums the input signal voltage with the positive offset voltage in the first frame. Step 1104c compares the sum with a fixed comparator input voltage. Step 1104d converts the negative counter value to a negative offset voltage in the third time frame. Step 1104e sums the input signal voltage with an inverted negative offset voltage in the third time frame. Step 1104c compares the sum to the comparator input voltage.

Step 1106a sets the output of a positive detection register to the first value in response to detection signals in the first time frame. Step 1106b sets the output of a negative detection register to the first value in response to detection signals in a periodic third time frame following the second time frame.

Step 1108a updates a positive counter value in the second time frame. Step 1108b updates a negative counter value in a periodic fourth time frame following the third time frame. Step 1110 uses the count to create a metric representative of the difference between the input signal voltage and the threshold.

In one aspect, using the count to create the predetermined difference between the input signal voltage and the threshold (Step 1110) includes determining an average input signal voltage by summing the positive counter value with the negative counter value.

A signal level detection system and method have been provided. Some examples of particular circuits and process flows have been given to illustrate the invention. However, the invention is not limited to just these examples. Other variations and embodiments will occur to those skilled in the art.

We claim:

1. An electronic signal level detection system comprising:
a comparison circuit having a first input to receive an analog input signal having a variable voltage, the comparison circuit comparing the input signal voltage to a threshold and supplying a comparator signal at an output for input signal voltages exceeding the threshold;
a detector having an input to receive the comparator signal and an output to supply detection signals responsive to receiving comparator signals in a periodic first time frame;
a counter having an input to receive the detection signals and an output to supply a count in a periodic second time frame following the first time frame;
a digital-to-analog converter (DAC) having an input to receive the count and having an output to supply a threshold voltage, for adjusting the threshold and creating a metric representative of the difference between the input signal voltage and the threshold in response to the count;
wherein the counter increments the count in response to receiving a detection signal in the first time frame, and decrements the count in response to not receiving a detection signal in the first time frame; and,
wherein the detector is a detection register setting a detection register output to a first value in response to receiving a comparator signal, and setting the detection register output to a second value, different from the first value, in response to not receiving a comparator signal.

2. The system of claim 1 wherein the comparison circuit includes:
a summing circuit having an input to accept the input signal voltage, an input connected to accept the threshold voltage, and an output to supply a sum voltage; and,
a comparator having a first input to accept the sum voltage, a second input connected to a fixed comparator input voltage, and an output to supply the comparator signal.

3. The system of claim 2 wherein the comparator compares an input signal voltage having a positive voltage with respect to an average input signal voltage, to a high voltage threshold in the first time frame, and compares a variable negative voltage with respect to the average, to the low voltage threshold in a periodic third time frame following the second time frame;
wherein the detection register sets a positive detection register output to the first value in response to receiving comparator signals in the first time frame, and sets a negative detection register output to the first value in response to receiving comparator signals in the third time frame; and,
wherein the counter supplies a positive counter value in the second time frame and supplies a negative counter value in a periodic fourth time frame following the third time frame.

4. The system of claim 3 wherein the DAC converts the positive counter value to a positive offset voltage in the first time frame, converts the negative counter value to a negative offset voltage in the third time frame, and supplies an inverted negative offset voltage; and,
wherein the summing circuit sums the input signal voltage with the positive offset voltage in the first frame, and sums the input signal voltage with the inverted negative offset voltage in the third time frame.

5. The system of claim 4 further comprising:
an averaging circuit having inputs to accept the positive and negative counter values, and supplying an average input signal voltage measurement at an output, determined by summing the positive counter value with the negative counter value.

6. The system of claim 1 wherein the comparison circuit is a comparator having a first input to accept the input signal voltage, a second input to accept the threshold voltage, and an output to supply the comparator signal.

7. The system of claim 1 further comprising:

a loss-of-signal circuit having an input connected to the counter to accept the count, and having an output to supply a message indicating the absence of the input signal in response to reading a count less than a low limit, and a message determining the presence of the input signal in response to reading a count greater than a high limit.

8. The system of claim 1 further comprising:

a variable gain amplifier having an input to accept a signal, a control input connected to receive the count, and an output to the comparison circuit to supply the input signal voltage, the amplifier adjusting the gain in response to the count.

9. The system of claim 1 wherein the counter supplies an n-bit counter value in response to the detection signals; and, wherein the DAC accepts the m most significant bits of the counter value, where m is less than or equal to n.

10. An electronic signal level detection system comprising:

a comparison circuit having a first input to receive an analog input signal having a variable voltage, the comparison circuit comparing the input signal voltage to a threshold and supplying a comparator signal at an output for input signal voltages exceeding the threshold;

a detector having an input to receive the comparator signal and an output to supply detection signals responsive to receiving comparator signals in a periodic first time frame;

a counter having an input to receive the detection signals and an output to supply a count in a periodic second time frame following the first time frame;

a digital-to-analog converter (DAC) having an input to receive the count and having an output to supply a threshold voltage, for adjusting the threshold and creating a metric representative of the difference between the input signal voltage and the threshold in response to the count; and, a loss-of-signal circuit having an input connected to the counter to accept the count, and having an output to supply a message indicating the absence of the input signal in response to reading a count less than a low limit, and a message determining the presence of the input signal in response to reading a count greater than a high limit.

* * * * *